(12) United States Patent
Gu et al.

(10) Patent No.: US 11,164,795 B2
(45) Date of Patent: Nov. 2, 2021

(54) TRANSISTORS WITH SOURCE/DRAIN REGIONS HAVING SECTIONS OF EPITAXIAL SEMICONDUCTOR MATERIAL

(71) Applicant: GLOBALFOUNDRIES U.S. Inc., Santa Clara, CA (US)

(72) Inventors: Sipeng Gu, Clifton Park, NY (US); Judson Holt, Ballston Lake, NY (US); Haiting Wang, Clifton Park, NY (US); Bangun Indajang, Mechanicville, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 15 days.

(21) Appl. No.: 16/828,273

(22) Filed: Mar. 24, 2020

(65) Prior Publication Data

US 2021/0305103 A1 Sep. 30, 2021

(51) Int. Cl.
*H01L 21/8238* (2006.01)
*H01L 27/092* (2006.01)
*H01L 29/10* (2006.01)
*H01L 29/08* (2006.01)

(52) U.S. Cl.
CPC ........... *H01L 21/823814* (2013.01); *H01L 21/823821* (2013.01); *H01L 27/0924* (2013.01); *H01L 29/0847* (2013.01); *H01L 29/1095* (2013.01)

(58) Field of Classification Search
CPC ......... H01L 21/823814; H01L 29/1095; H01L 27/0924; H01L 21/823821; H01L 29/0847
See application file for complete search history.

(56) References Cited

U.S. PATENT DOCUMENTS

| 10,249,755 B1* | 4/2019 | Cheng ................ H01L 21/3086 |
| 2015/0255543 A1 | 9/2015 | Cheng et al. |
| 2015/0332972 A1 | 11/2015 | Wu et al. |
| 2018/0286861 A1* | 10/2018 | Choi .................. H01L 27/0924 |
| 2019/0148492 A1 | 5/2019 | Yong et al. |

* cited by examiner

*Primary Examiner* — Karen Kusumakar
*Assistant Examiner* — Adam S Bowen
(74) *Attorney, Agent, or Firm* — Thompson Hine LLP; Francois Pagette

(57) ABSTRACT

Structures for a field-effect transistor and methods of forming a structure for a field-effect transistor. First and second gate structures extend over the semiconductor body. A source/drain region is positioned laterally between the first gate structure and the second gate structure. The source/drain region includes a semiconductor layer having a first section, a second section, and a third section. A first portion of the semiconductor body is positioned between the first section of the semiconductor layer and the second section of the semiconductor layer. A second portion of the semiconductor body is positioned between the second section of the semiconductor layer and the third section of the semiconductor layer.

20 Claims, 9 Drawing Sheets

TRANSISTORS WITH SOURCE/DRAIN REGIONS HAVING SECTIONS OF EPITAXIAL SEMICONDUCTOR MATERIAL

BACKGROUND

The present invention relates to semiconductor device fabrication and integrated circuits and, more specifically, to structures for a field-effect transistor and methods of forming a structure for a field-effect transistor.

Complementary-metal-oxide-semiconductor (CMOS) processes may be employed to build a combination of p-type and n-type field-effect transistors that are used as devices to construct, for example, logic cells. Field-effect transistors generally include a source, a drain, a channel region between the source and drain, and a gate electrode overlapped with the channel region. When a control voltage exceeding a characteristic threshold voltage is applied to the gate electrode, carrier flow occurs in the channel region between the source and drain to produce a device output current. A field-effect transistor may include multiple gates that overlap with multiple channel regions.

One approach for forming source and drain of a field-effect transistor is to implant ions containing a p-type dopant or an n-type dopant into regions of a semiconductor body to provide the source and drain. Another approach is to epitaxially grow sections of a semiconductor material from regions of the semiconductor body to provide the source and drain. The semiconductor material may be in situ doped during epitaxial growth with either a p-type dopant or an n-type dopant.

A problem associated with wide gate pitches in a multi-gate field-effect transistor is underfilling of the semiconductor material that is epitaxially grown in cavities to provide the sources and drains. The underfilling may degrade device performance, such as degrading radio-frequency performance metrics like power gain. The underfilling may also degrade other performance metrics. For example, the drain current when the transistor is biased in the saturation region (Idsat) may be reduced. Contact resistance with the sources and drains may be increased, and underfilling may also cause contact open issues.

Improved structures for a field-effect transistor and methods of forming a structure for a field-effect transistor are needed.

SUMMARY

In an embodiment of the invention, a structure for a field-effect transistor is provided. The structure includes first and second gate structures that extend over the semiconductor body and a source/drain region positioned laterally between the first gate structure and the second gate structure. The source/drain region includes a semiconductor layer having a first section, a second section, and a third section. A first portion of the semiconductor body is positioned between the first section of the semiconductor layer and the second section of the semiconductor layer. A second portion of the semiconductor body is positioned between the second section of the semiconductor layer and the third section of the semiconductor layer.

In an embodiment of the invention, a method of forming a structure for a field-effect transistor is provided. The method includes forming first and second gate structures that extend over a semiconductor body and forming a first section, a second section, and a third section of a semiconductor layer laterally between the first gate structure and the second gate structure. A portion of the semiconductor body is positioned between the first section of the semiconductor layer and the second section of the semiconductor layer. A second portion of the semiconductor body is positioned between the second section of the semiconductor layer and the third section of the semiconductor layer. The first section, the second section, and the third section of the semiconductor layer are components of a source/drain region of the field-effect transistor.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
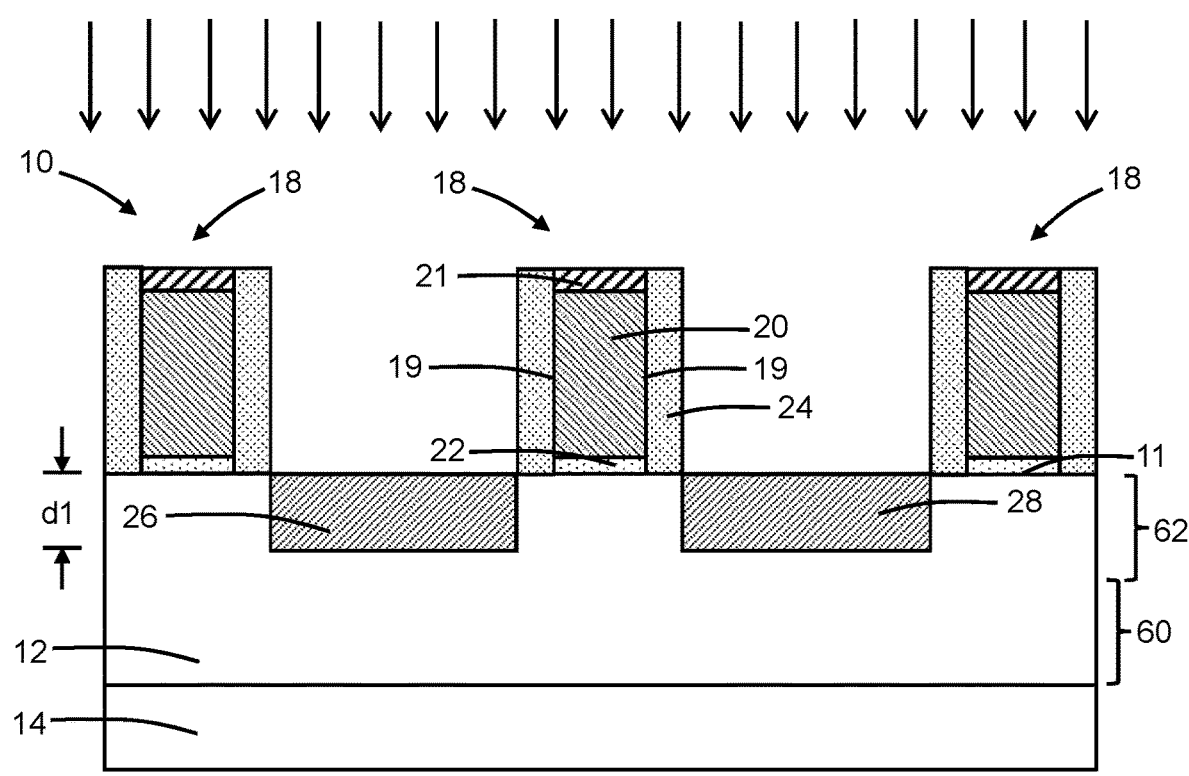
FIGS. 1-4 are cross-sectional views of a structure for a field-effect transistor at successive fabrication stages of a processing method in accordance with embodiments of the invention.

With reference to FIG. 1 and in accordance with embodiments of the invention, a structure 10 for a field-effect transistor includes a fin 12 that is arranged over, and projects upwardly away from, a substrate 14. The fin 12 and the substrate 14 may be composed of a single-crystal semiconductor material, such as single-crystal silicon. The fin 12 may be formed by patterning the substrate 14 with lithography and etching processes or by a self-aligned multi-patterning process. Shallow trench isolation 16 (FIGS. 5A, 5B, 5C) may surround a lower section 60 of the fin 12. An upper section 62 of the fin 12 is revealed above a top surface of the shallow trench isolation 16. The fin 12 defines a semiconductor body that may be used to form a field-effect transistor. The upper section 62 of the fin 12 includes a top surface 11 and side surfaces 13.

Gate structures 18 extend laterally along respective longitudinal axes over and across the fin 12 and onto the shallow trench isolation 16. Each gate structure 18 is aligned transverse to the fin 12 and overlaps with, and wraps about, the top surface 11 and side surfaces 13 of the upper section 62 of the fin 12. Each gate structure 18 may include a dummy gate 20 composed of a conductor, such as polycrystalline silicon (i.e., polysilicon), and a dielectric layer 22 composed of a dielectric material, such as silicon dioxide. A gate cap 21 may be arranged over each gate structure 18.

Sidewall spacers 24 are arranged adjacent to the side surfaces or sidewalls 19 of each gate structure 18. The sidewall spacers 24 may be formed by depositing a conformal layer composed of a dielectric material, such as a low-k dielectric material, and etching the deposited conformal layer with an anisotropic etching process, such as reactive ion etching.

Doped regions 26, 28 may be formed in the fin 12 and are laterally arranged between the sidewall spacers 24 on adjacent pairs of the gate structures 18. The doped regions 26, 28 contain a concentration of either an n-type or p-type dopant. The doped regions 26, 28 may be formed by an ion implantation process that introduces energetic ions, as indicated diagrammatically by the single-headed arrows, with ion trajectories that stop over a depth range in the fin 12. The ions may be generated from a suitable source gas and implanted into the fin 12 with given implantation conditions using an ion implantation tool. The implantation conditions (e.g., ion species, dose, kinetic energy, tilt angle) may be selected to tune the characteristics (e.g., depth profile) of the doped regions 26, 28. An implantation mask may be temporarily formed over regions (not shown) of the substrate 14 used to form other types of field-effect transistors. The doped regions 26, 28 extend to a depth, d1 relative to the top surface 11 of the fin 12.

In an embodiment, the doped regions 26, 28 may be concurrently formed in the fin 12 by implanting ions of a p-type dopant (e.g., boron) that provides p-type electrical conductivity. In an alternative embodiment, the doped regions 26, 28 may be concurrently formed in the fin 12 by implanting ions of an n-type dopant (e.g., phosphorus and/or arsenic) that provides n-type electrical conductivity. In an embodiment, the dopant concentrations of the doped regions 26, 28 may be equal or substantially equal. The gate structures 18 and sidewall spacers 24 may function to self-align the ion-implantation process forming the doped regions 26, 28 in the fin 12.

In an alternative embodiment, the doped regions 26, 28 may be omitted from the device construction such that the original doping, if any, of the fin 12 is unmodified.

Figure 2:
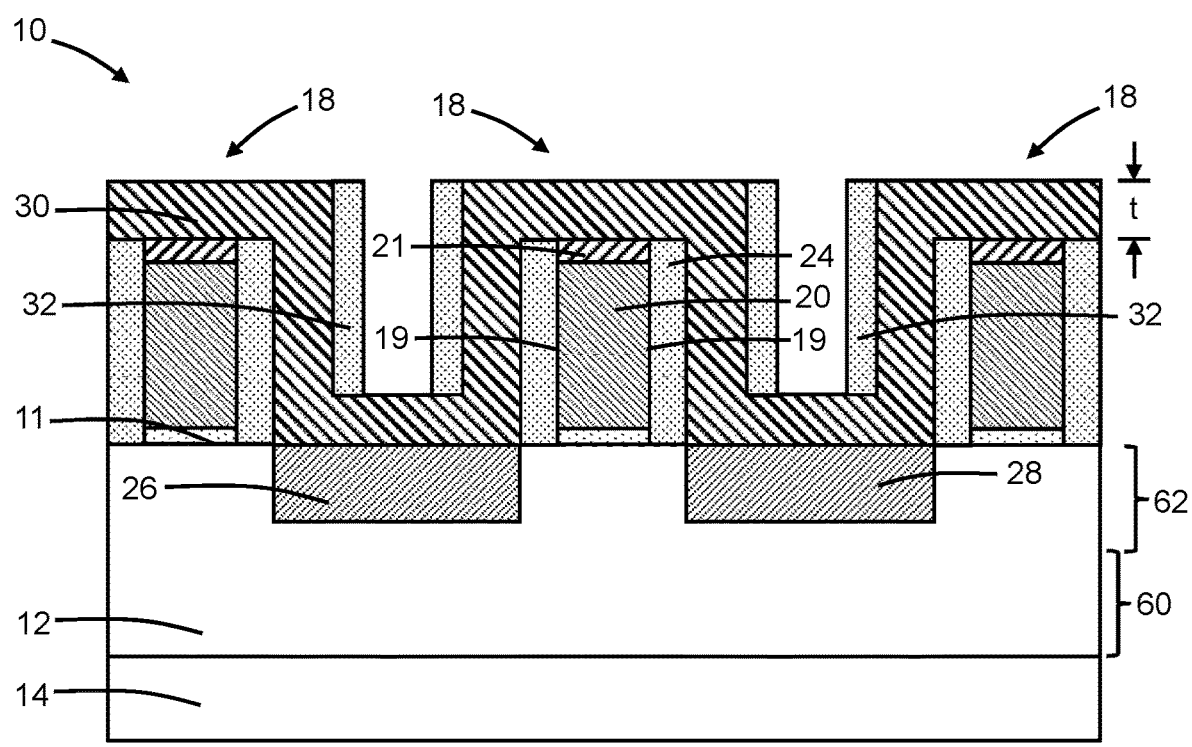

With reference to FIG. 2 in which like reference numerals refer to like features in FIG. 1 and at a subsequent fabrication stage, a conformal layer 30 is deposited as a liner over the gate caps 21 on the gate structures 18, the sidewall spacers 24, and the top surface 11 of the fin 12 over the doped regions 26, 28. The conformal layer 30 may be composed of a metal, such as tantalum, tantalum nitride, titanium, or titanium nitride, and may be deposited by, for example, atomic layer deposition. The material of the conformal layer 30 may be chosen to differ from the materials of the gate caps 21 and sidewall spacers 24 in order to facilitate subsequent etching processes. The conformal layer 30 may be deposited with a conformal thickness, t, that is independent of location.

Spacers 32 are formed by depositing a conformal layer over the conformal layer 30 on the gate caps 21 on the gate structures 18, the sidewall spacers 24, and the doped regions 26, 28, and etching with an anisotropic etching process. The spacers 32 may be composed of, for example, amorphous carbon, silicon dioxide, silicon nitride, or a metal oxide, and may be deposited by, for example, atomic layer deposition. The etching process may be a reactive ion etching process that etches the material composing the spacers 32 selective to the material composing the conformal layer 30. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal. The spacers 32 have a width that is established by the thickness of the etched conformal layer.

Figure 3:
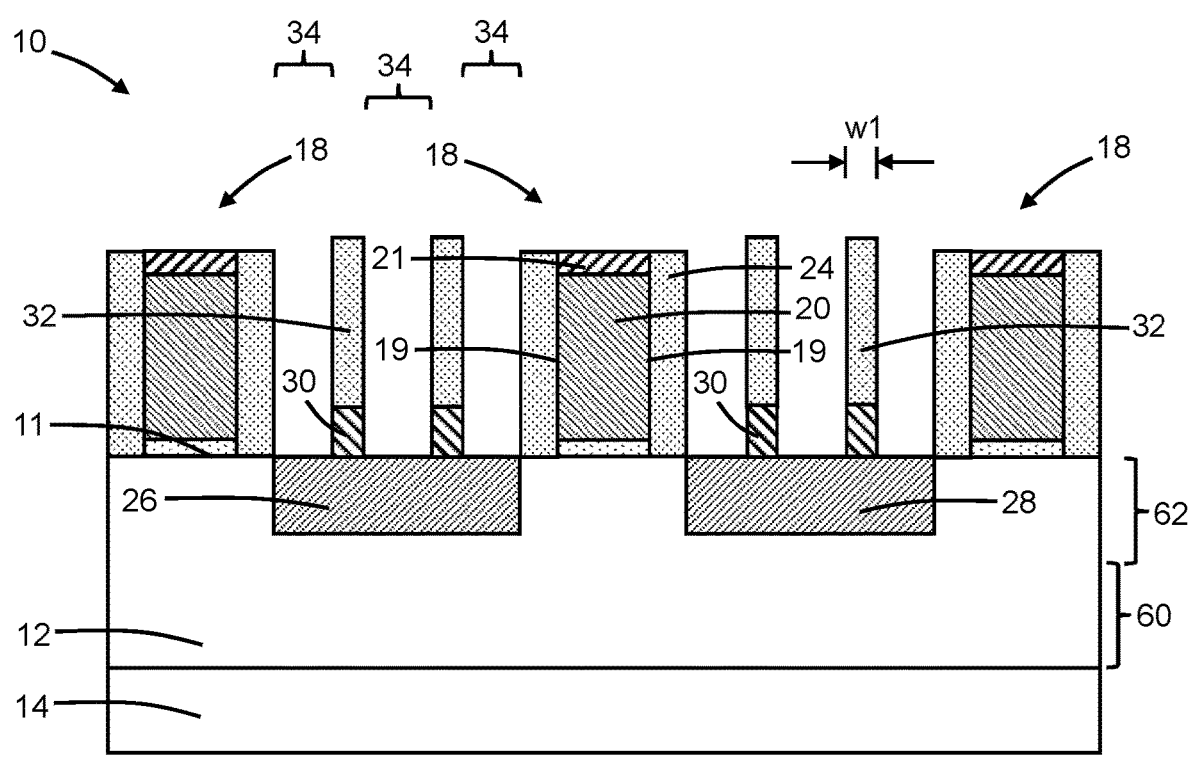

With reference to FIG. 3 in which like reference numerals refer to like features in FIG. 2 and at a subsequent fabrication stage, the conformal layer 30 (FIG. 2) is etched with an anisotropic etching process. The etching process may be a reactive ion etching process that etches the material constituting the conformal layer 30 selective to the materials of the fin 12, gate caps 21, sidewall spacers 24, and spacers 32. The spacers 32, which are temporary components and may be shortened by the etching process, mask underlying portions of the conformal layer 30. The conformal layer 30 is removed by the etching process except for the masked portions of the conformal layer 30. The non-removed portions of the conformal layer 30 may have a width, w1, equal or substantially equal to the width of the spacers 32.

Openings 34 are defined between the spacers 32 and the sidewall spacers 24. The openings 34 extend in a vertical direction to the top surface 11 of the fin 12 over each of the doped regions 26, 28. The top surface 11 of the fin 12 is exposed at the bottom of the openings 34 due to the full removal of the overlying portions of the conformal layer 30 by the etching process.

Figure 4:
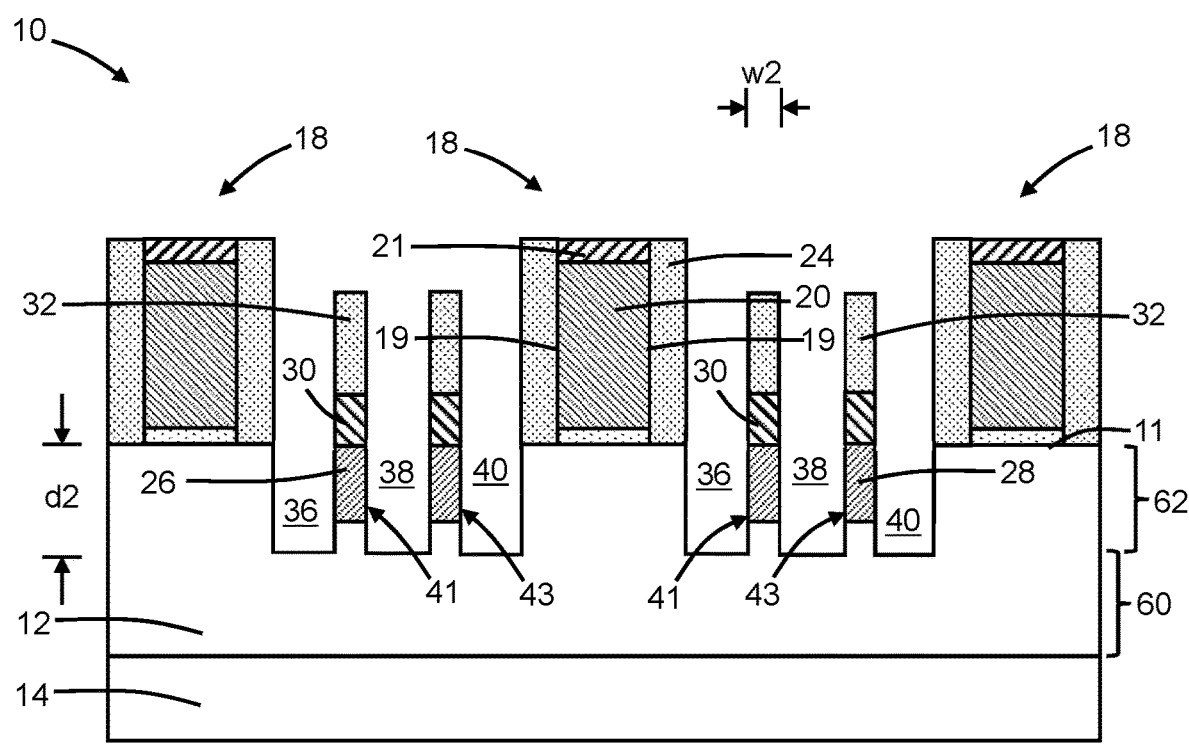

With reference to FIG. 4 in which like reference numerals refer to like features in FIG. 3 and at a subsequent fabrication stage, cavities 36, 38, 40 are formed in the fin 12 between each adjacent pair of gate structures 18. The cavities 36, 38, 40 may extend to a given depth, d2, into the fin 12. The cavities 36, 38, 40 may be formed by an etching process that is selective to the materials of the gate caps 21, sidewall spacers 24, and spacers 32. The spacers 32 function as protective caps during the etching process such that portions 41, 43 of the fin 12 are masked and preserved. The portion 41 of the fin 12 is located laterally between the cavity 36 and the cavity 38, and the portion 43 of the fin 12 is located laterally between the cavity 38 and the cavity 40. The spacers 32 may be partially consumed and thereby shortened during the etching process. The portions 41, 43 of the fin 12 may have equal or substantially equal widths, w2. A portion of the conformal layer 30 is positioned on the top surface 11 of the fin 12 over each of the portions 41, 43 of the fin 12, and the width, w2, of the portions 41, 43 may be equal or substantially equal to the width, w1, of the overlying portions of the conformal layer 30.

The formation of the cavities 36, 38, 40 removes portions of the doped regions 26, 28 adjacent to the portions 41, 43 of the fin 12. Portions of the doped region 26 remain intact within the respective portions 41, 43 of the fin 12 between one pair of gate structures 18, and portions of the doped region 28 remain intact within the respective portions 41, 43 of the fin 12 between the other pair of gate structures 18. The portions of the doped regions 26, 28 may have substantially equal thicknesses that are equal to the depth, d1 (FIG. 1). In an embodiment, the depth, d2, of the cavities 38, 40 may be greater than the thickness of the doped regions 26, 28.

With reference to FIGS. 5, 5A, 5B, 5C in which like reference numerals refer to like features in FIG. 4 and at a subsequent fabrication stage, the spacers 32 are removed with an etching process selective to the materials of the fin 12, gate caps 21, sidewall spacers 24, and conformal layer 30. The selective etching process may be a reactive etching process. The portions of the conformal layer 30 exposed by the removal of the spacers 32 are not removed and instead remain on the top surface 11 over the portions 41, 43 of the fin 12.

A layer 42 containing an epitaxial semiconductor material is grown in respective sections from the surfaces of the fin 12 bordering the cavities 36, 38, 40 and, in particular, from the side surfaces 13 of the portions 41, 43 of the fin 12 between the cavities 38, 40. The sections of the epitaxial semiconductor layer 42 grow independently inside each of the cavities 36, 38, 40, which collectively provide a significantly larger surface area for epitaxial growth than a single large cavity. The epitaxial semiconductor layer 42 may extend laterally from the space between the gate structures 18. Each section of the epitaxial semiconductor layer 42 is located in part in one of the cavities 36, 38, 40, and extends in part above the top surface 11 of the fin 12. The different sections of the epitaxial semiconductor layer 42 merge over the portions 41, 43 of the fin 12 and the portions of the conformal layer 30 over the portions 41, 43 of the fin 12. The portions of the conformal layer 30 may be encapsulated inside of the epitaxial semiconductor layer 42.

The epitaxial growth process may be selective in that the semiconductor material does not grow from dielectric surfaces, such as the surfaces of the shallow trench isolation 16, the gate caps 21, and the sidewall spacers 24. The epitaxial semiconductor layer 42 may be in situ doped during epitaxial growth with a concentration of a dopant. In an embodiment, the epitaxial semiconductor layer 42 may have the same conductivity type as the doped regions 26, 28. In an embodiment, the epitaxial semiconductor layer 42 may be in situ doped during epitaxial growth with an n-type dopant, such as phosphorus and/or arsenic, that provides n-type conductivity. In an alternative embodiment, the epitaxial semiconductor layer 42 may be in situ doped during epitaxial growth with a p-type dopant, such as boron, that provides p-type conductivity. The epitaxial semiconductor layer 42 may have a composition that contains germanium and silicon and, in an embodiment, the epitaxial semiconductor layer 42 may be composed of silicon-germanium. In an embodiment, the epitaxial semiconductor layer 42 may be composed of silicon-germanium and may contain a p-type dopant (e.g., boron). In an alternative embodiment, the epitaxial semiconductor layer 42 may be composed of silicon and may contain an n-type dopant (e.g., phosphorus).

The sections of the epitaxial semiconductor layer 42 in each group of cavities 36, 38, 40 contact the portion 41 of the fin 12 between the cavity 36 and the cavity 38, as well as the portion 43 of the fin 12 between the cavity 38 and the cavity 40. The section of the epitaxial semiconductor layer 42 in each cavity 36 may be in direct contact with one side surface 13 of the portion 41 of the fin 12, the section of the epitaxial semiconductor layer 42 in each cavity 38 may be in direct contact with one side surface 13 of the portion 41 of the fin 12 and one side surface 13 of the portion 43 of the fin 12, and the section of the epitaxial semiconductor layer 42 in each cavity 40 may be in direct contact with a side surface 13 of the portion 43 of the fin 12. Portions of the doped region 26 or portions of the doped region 28 are included in the portions 41, 43 of the fin 12 beneath the portions of the conformal layer 30. The portion 41 of the fin 12 defines a partition between the section of the epitaxial semiconductor layer 42 in the cavity 36 and the section of the epitaxial semiconductor layer 42 in the cavity 38. The portion 43 of the fin 12 defines a partition between the section of the epitaxial semiconductor layer 42 in the cavity 38 and the section of the epitaxial semiconductor layer 42 in the cavity 40.

Figure 5:
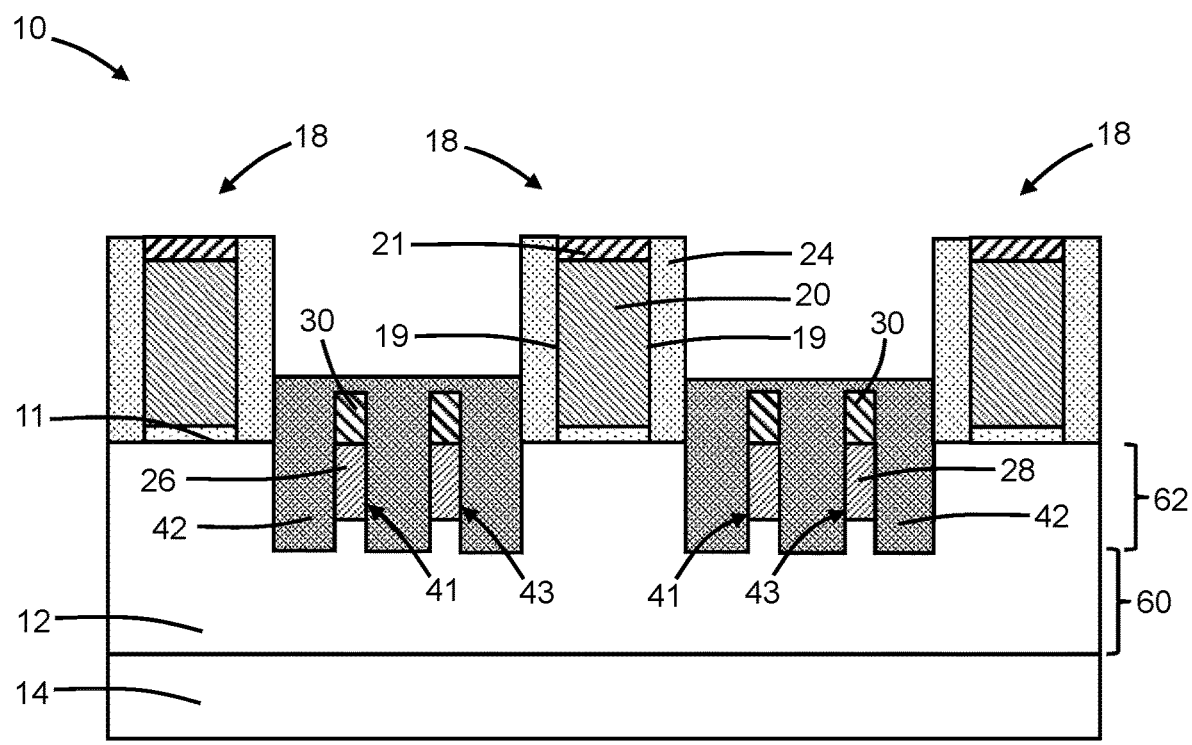
FIG. 5 is a cross-sectional view of the structure at a fabrication stage of the processing method subsequent to FIG. 4.
Figure 5A:
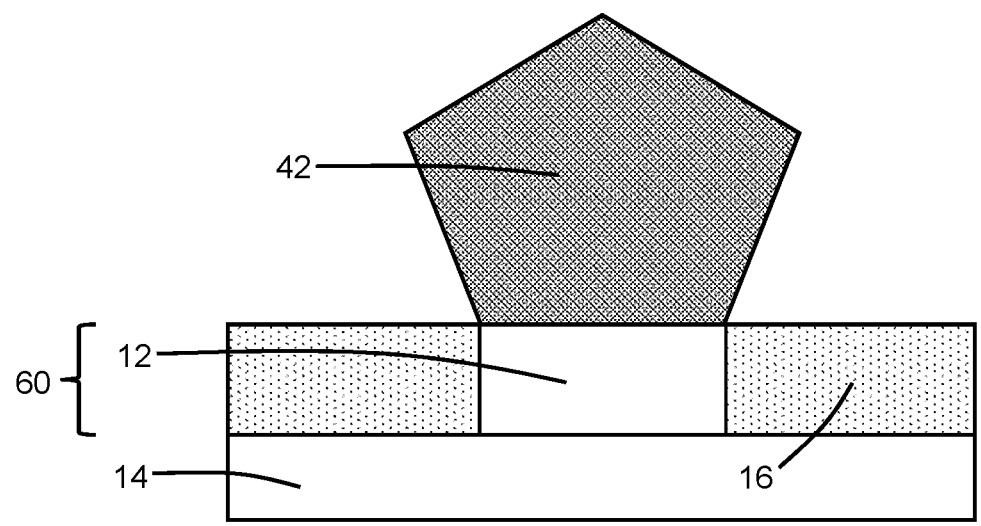
FIGS. 5A, 5B, 5C are cross-sectional views of different portions of the structure of FIG. 5 taken generally parallel to the longitudinal axes of the gate structures.
Figure 5B:
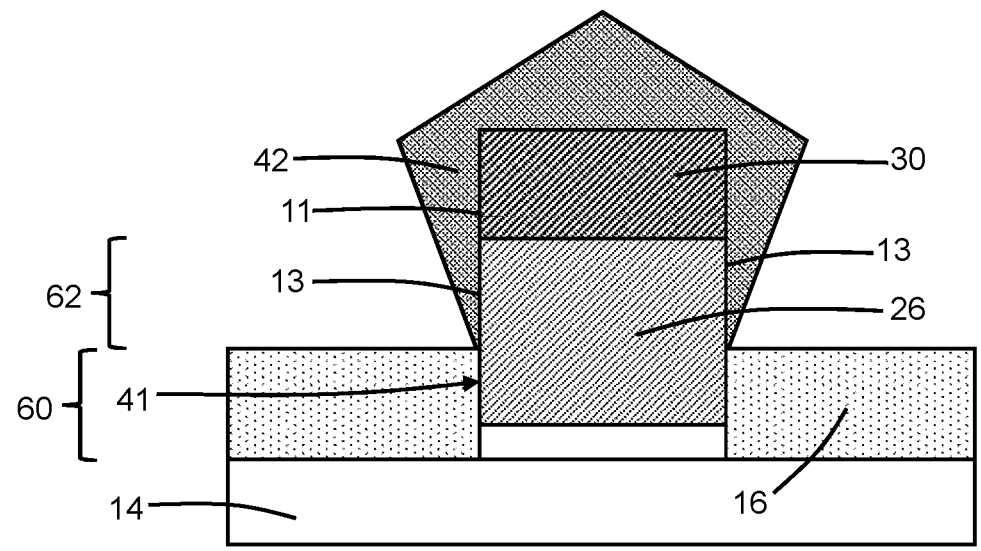
Figure 5C:
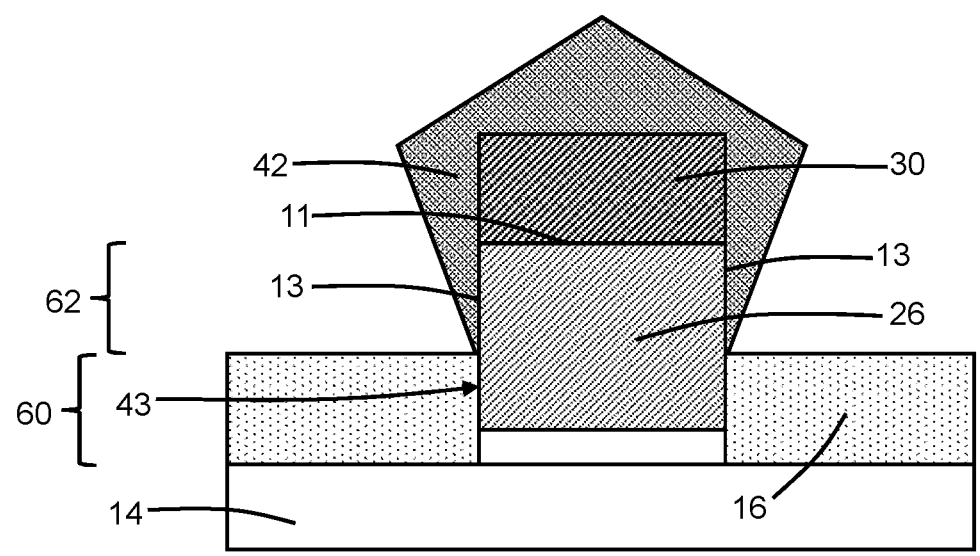
Figure 6:
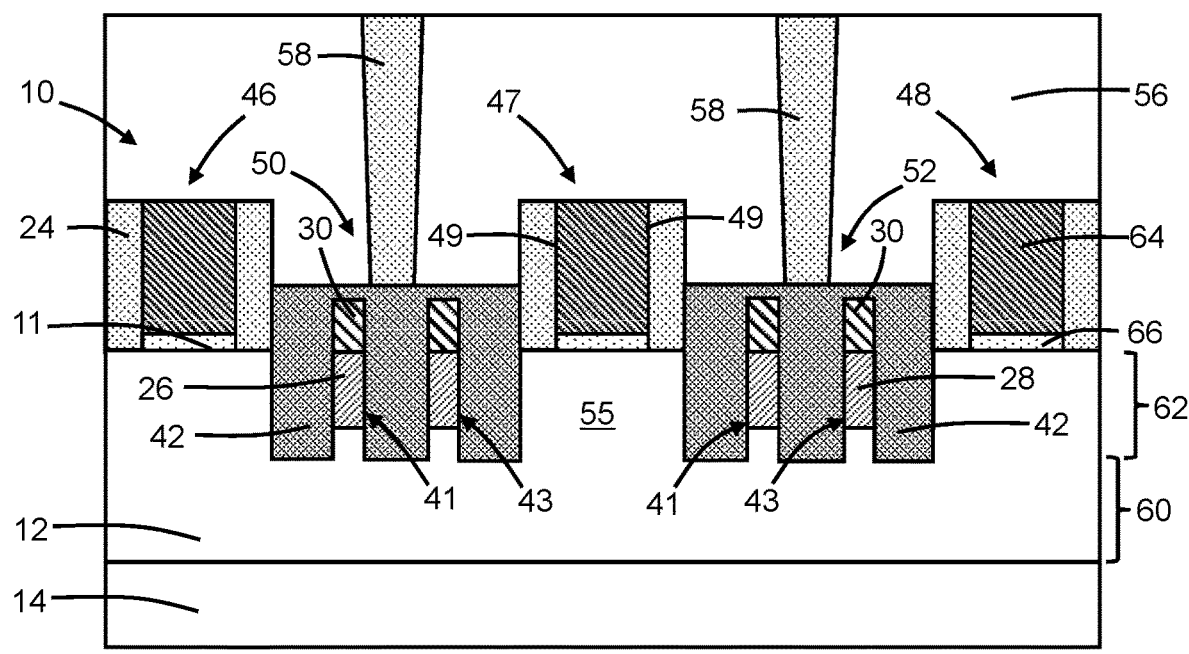
FIG. 6 is a cross-sectional view of the structure at a fabrication stage of the processing method subsequent to FIG. 5.

With reference to FIG. 6 in which like reference numerals refer to like features in FIG. 5 and at a subsequent fabrication stage, a replacement gate process is performed to replace the gate structures 18 with gate structures 46, 47, 48 and complete the structure 10 for the field-effect transistor. The gate structures 46, 47, 48 may include an electrode layer 64 composed of one or more metal gate materials, such as work function metals, and a gate dielectric layer 66 composed of a dielectric material, such as a high-k dielectric material like hafnium oxide. The gate structures 46, 47, 48 have opposite side surfaces 49 and the sidewall spacers 24 are located adjacent to the side surfaces 49.

The structure 10 includes a source/drain region 50 provided by the sections of the epitaxial semiconductor layer 42, the portions 41, 43 of the fin 12, and the doped region 26 in the portions 41, 43 of the fin 12. The structure 10 includes a source/drain region 52 provided by the sections of the epitaxial semiconductor layer 42, the portions 41, 43 of the fin 12, and the doped region 28 in the portions 41, 43 of the fin 12. As used herein, the term "source/drain region" means a doped region of semiconductor material that can function as either a source or a drain of a field-effect transistor. In an embodiment, the source/drain region 50 may provide a source in the structure 10, and the source/drain region 52 may provide a drain in the structure 10. In an alternative embodiment, the source/drain region 50 may provide a drain in the structure 10, and the source/drain region 52 may provide a source in the structure 10. The source/drain regions 50, 52 are doped to have a conductivity type of the same polarity.

The source/drain region 50 is located between a side surface 49 of the gate structure 46 and a side surface 49 of the gate structure 47, and the source/drain region 52 is located between a side surface 49 of the gate structure 47 and a side surface 49 of the gate structure 48. The fin 12 provides a semiconductor body used to form the source/drain regions 50, 52. A channel region 55 is disposed in a portion of the fin 12 between the source/drain region 50 and the source/drain region 52 and beneath the overlying gate structure 47.

Middle-of-line processing and back-end-of-line processing follow, which includes formation of contacts, vias, and wiring for an interconnect structure that is coupled with the field-effect transistor. Contacts 56, which are located in an interlayer dielectric layer 58 of the interconnect structure, are coupled with the source/drain regions 50, 52.

The source/drain regions 50, 52 may exhibit improvements in filling by the epitaxial semiconductor material of the epitaxial semiconductor layer 42. Reliance upon a group of smaller cavities 36, 38, 40, instead of a single larger cavity, provides smaller volumes to be filled by epitaxially-grown semiconductor material and may compensate for larger gate pitches to alleviate underfilling. The source/drain regions 50, 52 may include a larger overall volume of epitaxial semiconductor material as a result of the sectioned formation and the alleviation of underfilling. The structure 10 may include additional gate structures with the wider gate pitch, and the source/drain regions 50, 52 may be repeated for the pairs of the gate structures to form a multi-gate field-effect transistor for use in a radiofrequency integrated circuit. The addition of the portions of the conformal layer 30, which are composed of a metal, to the source/drain regions 50, 52 may function to lower the contact resistance of the source/drain regions 50, 52.

Figure 7:
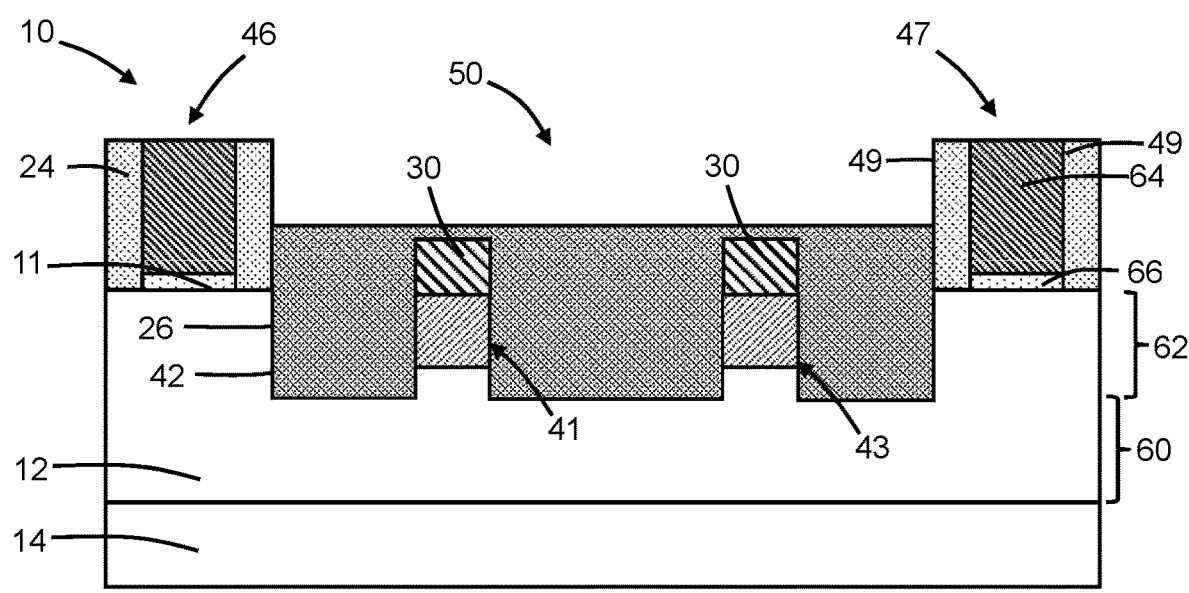
FIG. 7 is a cross-sectional view of a structure in accordance with alternative embodiments of the invention.

With reference to FIG. 7 in which like reference numerals refer to like features in FIG. 6 and in accordance with alternative embodiments, the width of the spacers 32 and/or the thickness of the conformal layer 30 may be used to adjust the widths of the individual sections of the epitaxial semiconductor layer 42 in each group of cavities 36, 38, 40 and the widths of the portions 41, 43 of the fin 12. For example and as shown in FIG. 7 for the source/drain region 50, the width of the spacers 32 may be increased and the thickness of the conformal layer 30 may also be increased to accommodate a wider gate pitch. Although not shown, the source/ drain region 52 may be modified in a manner similar to the source/drain region 50. The width of the spacers 32 and the thickness of the conformal layer 30 may be tuned to adjust the formation of the source/drain regions 50, 52 to different gate pitches of the gate structures 46, 47, 48.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
    a semiconductor body including a first cavity, a second cavity, and a third cavity;
    a first gate structure that extends over the semiconductor body;
    a second gate structure that extends over the semiconductor body; and
    a first source/drain region laterally between the first gate structure and the second gate structure, the first source/drain region including a first semiconductor layer having a first section, a second section, and a third section, the first section of the first semiconductor layer positioned in the first cavity, the second section of the first semiconductor layer positioned in the second cavity, and the third section of the first semiconductor layer positioned in the third cavity,
    wherein the semiconductor body includes a first portion and a second portion, the first portion of the semiconductor body is positioned between the first section of the first semiconductor layer and the second section of the first semiconductor layer, and the second portion of the semiconductor body is positioned between the second section of the first semiconductor layer and the third section of the first semiconductor layer.

2. The structure of claim 1 wherein the second section of the first semiconductor layer in the second cavity is in direct contact with the second portion of the semiconductor body, and the second section of the first semiconductor layer in the second cavity in direct contact with the first portion of the semiconductor body.

3. The structure of claim 2 wherein the first section of the first semiconductor layer in the first cavity is in direct contact with the first portion of the semiconductor body, and the third section of the first semiconductor layer in the third cavity is in direct contact with the second portion of the semiconductor body.

4. The structure of claim 1 wherein the semiconductor body is a semiconductor fin.

5. The structure of claim 1 wherein the semiconductor body has a top surface, and the first section, the second section, and the third section of the first semiconductor layer include respective portions that merge over the first portion of the semiconductor body and the second portion of the semiconductor body.

6. The structure of claim 1 wherein the semiconductor body has a top surface, the first portion of the semiconductor body includes a first doped region containing a first dopant, the second portion of the semiconductor body includes a second doped region containing the first dopant, and the first doped region and the second doped region have substantially equal thicknesses relative to the top surface of the semiconductor body.

7. The structure of claim 1 further comprising:
    a semiconductor substrate,
    wherein the semiconductor body is a semiconductor fin that projects away from the semiconductor substrate.

8. The structure of claim 1 further comprising:
    a contact connected to the first source/drain region.

9. The structure of claim 1 further comprising:
    a second source/drain region including a second semiconductor layer having a first section, a second section, and a third section,
    wherein the semiconductor body includes a third portion and a fourth portion, the third portion of the semiconductor body is positioned between the first section of the second semiconductor layer and the second section of the second semiconductor layer, the fourth portion of the semiconductor body is positioned between the second section of the second semiconductor layer and the third section of the second semiconductor layer, and the first gate structure is positioned laterally between the first source/drain region and the second source/drain region.

10. The structure of claim 1 wherein the semiconductor body has a top surface, and further comprising:
a layer having a first portion on the top surface of the semiconductor body over the first portion of the semiconductor body and a second portion on the top surface of the semiconductor body over the second portion of the semiconductor body.

11. The structure of claim 10 wherein the layer is comprised of a metal, and the first section, the second section, and the third section of the first semiconductor layer include respective portions that merge over the first portion of the layer and the second portion of the layer.

12. A structure for a field-effect transistor, the structure comprising:
a semiconductor body having a top surface, a first portion, and a second portion;
a first gate structure that extends over the semiconductor body;
a second gate structure that extends over the semiconductor body;
a source/drain region laterally between the first gate structure and the second gate structure, the source/drain region including a semiconductor layer having a first section, a second section, and a third section; and
a layer having a first portion on the top surface of the semiconductor body over the first portion of the semiconductor body and a second portion on the top surface of the semiconductor body over the second portion of the semiconductor body,
wherein the first portion of the semiconductor body is positioned between the first section of the semiconductor layer and the second section of the semiconductor layer, and the second portion of the semiconductor body is positioned between the second section of the semiconductor layer and the third section of the semiconductor layer.

13. The structure of claim 12 wherein the first section, the second section, and the third section of the semiconductor layer include respective portions that merge over the first portion of the layer and the second portion of the layer.

14. The structure of claim 12 wherein the layer is comprised of a metal.

15. The structure of claim 12 wherein the first portion of the layer is positioned directly on the top surface of the semiconductor body over the first portion of the semiconductor body, and the second portion of the layer is positioned directly on the top surface of the semiconductor body over the second portion of the semiconductor body.

16. A method of forming a structure for a field-effect transistor, the method comprising:

forming a first cavity, a second cavity, and a third cavity in a semiconductor body;
forming a first gate structure that extends over the semiconductor body;
forming a second gate structure that extends over the semiconductor body;
forming a first section, a second section, and a third section of a semiconductor layer laterally between the first gate structure and the second gate structure,
wherein the first section of the semiconductor layer is epitaxially grown in the first cavity, the second section of the semiconductor layer is epitaxially grown in the second cavity, and the third section of the semiconductor layer is epitaxially grown in the third cavity, the semiconductor body includes a first portion and a second portion, the first portion of the semiconductor body is positioned between the first section of the semiconductor layer and the second section of the semiconductor layer, the second portion of the semiconductor body is positioned between the second section of the semiconductor layer and the third section of the semiconductor layer, and the first section, the second section, and the third section of the semiconductor layer are components of a source/drain region of the field-effect transistor.

17. The method of claim 16 wherein forming the first section, the second section, and the third section of the semiconductor layer laterally between the first gate structure and the second gate structure comprises:
forming a first spacer and a second spacer on the semiconductor body at respective positions laterally between the first gate structure and the second gate structure.

18. The method of claim 17 wherein forming the first cavity, the second cavity, and the third cavity in the semiconductor body comprises:
etching the semiconductor body with the first spacer and the second spacer on the semiconductor body to form the first cavity, the second cavity, and the third cavity in the semiconductor body.

19. The method of claim 18 wherein the first portion of the semiconductor body is positioned beneath the first spacer and the second portion of the semiconductor body is positioned beneath the second spacer.

20. The method of claim 18 wherein the first cavity is formed in the semiconductor body laterally between the first gate structure and the first spacer, the second cavity is formed in the semiconductor body laterally between the first spacer and the second spacer, and the third cavity is formed in the semiconductor body laterally between the second spacer and the second gate structure.

* * * * *